INVENTOR.
PHILIP D. COREY
BY Isidore Match
ATTORNEY

Feb. 21, 1967 P. D. COREY 3,305,759

OSCILLATOR

Filed Aug. 27, 1962 5 Sheets-Sheet 2

INVENTOR.
PHILIP D. COREY

BY Isidore Match

ATTORNEY

INVENTOR.
PHILIP D. COREY
BY Isidore Match
ATTORNEY

OSCILLATOR

Filed Aug. 27, 1962

INVENTOR.
PHILIP D. COREY

BY Isidore Match

ATTORNEY

Feb. 21, 1967 P. D. COREY 3,305,759

OSCILLATOR

Filed Aug. 27, 1962 5 Sheets-Sheet 5

INVENTOR
PHILIP D. COREY
BY Isidore Match
ATTORNEY

United States Patent Office 3,305,759
Patented Feb. 21, 1967

3,305,759
OSCILLATOR

Philip D. Corey, Waynesboro, Va., assignor to General Electric Company, a corporation of New York Filed Aug. 27, 1962, Ser. No. 219,647
11 Claims. (Cl. 321—25)

This invention relates to rectangular wave oscillators. More particularly, it relates to an improved multivibrator suitable for use as a driver circuit and a power switching circuit.

In many situations, particularly in static inverters for switching D.C. power to A.C. power, there is frequently a need for a stable rectangular wave oscillator which may be used as the driver circuit therein or even as the main power switching stage thereof.

In accordance with the aforesaid, it is an important object of this invention to provide a rectangular wave multivibrator circuit which is suitable for operation with high voltage D.C. power sources.

It is a further object to provide a multivibrator in accordance with the preceding object wherein the output frequency thereof is proportional to the D.C. voltage applied thereto.

It is another object to provide a multivibrator in accordance with the preceding objects wherein the frequency may be controlled with low power level control signals.

It is still another object to provide a multivibrator in accordance with the preceding objects wherein the output frequency thereof may be maintained at a substantially constant value independent of the D.C. supply voltage level.

It is yet another object to provide an arrangement wherein a multivibrator provided in accordance with the preceding objects can be frequency synchronized with a "master" source of a rectangular wave signal, such synchronization being capable of controlling the relative phase displacement between the output of the multivibrator and the master control signal.

It is still a further object to provide a static inverter utilizing the multivibrator and master control arrangement provided in accordance with the preceding objects which is capable of operating from a relatively high D.C. voltage supply source and which produces a constant frequency and voltage output despite fluctuations in the D.C. supply voltage and output load.

It is yet a further object to provide a static inverter in accordance with the preceding object wherein inherent short circuit protection is effected.

It is another object to provide circuits in accordance with the preceding operations wherein transistors may be utilized as power switching devices.

Generally speaking, and in accordance with the invention, there is provided in combination with a center tapped D.C. voltage source, a pair of switching devices capable of being in a conductive and a non-conductive state respectively connected across different halves of the source, a saturable element in circuit with the devices and the source, current flowing through the saturable element in opposite directions in response to conductive states respectively in the switching devices, the attaining of saturation of the saturable element causing a switching of the states of the switching devices.

The features of this invention which are believed to be new are set forth with particularity in the appended claims. The invention itself, however, may best be understood by reference to the following description when taken in conjunction with the accompanying drawings which show illustrative embodiments in accordance with the principles of the invention.

Figure 1:
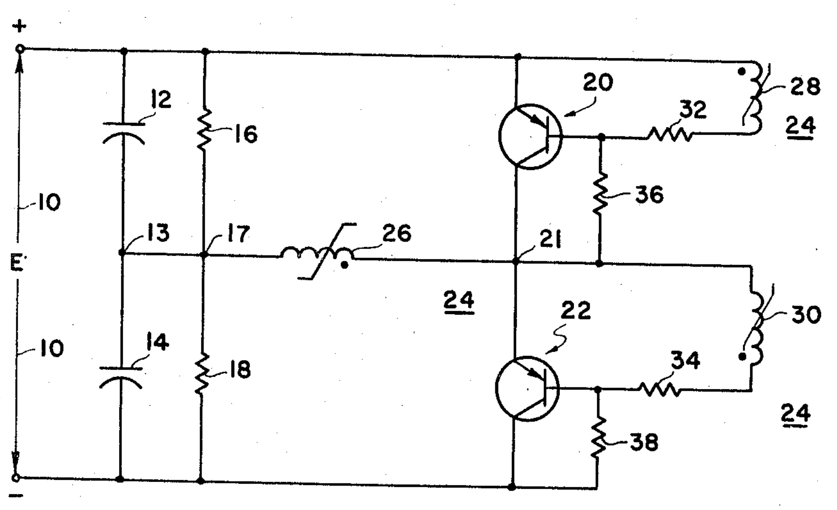
FIG. 1 is a schematic depiction of a first embodiment of a rectangular wave multivibrator in accordance with the principles of the invention.

Referring now to FIG. 1, there is shown connected across a D.C. source 10 (not shown), the parallel combination of serially connected capacitors 12 and 14 and serially connected resistors 16 and 18, junctions 13 and 17 being connected to each other. With this arrangement, there is accordingly provided a center tapped D.C. supply. Also connected across source 10 is the series combination of the emitter to collector path of a transistor 20 and the emitter to collector path of a transistor 22. Connected between junction 17 and the junction 21 of the collector of transistor 20 and the emitter of transistor 22 is the primary winding 26 of a saturable transformer 24.

A first secondary winding 28 of transformer 24 has one terminal connected to the emitter of transistor 20 and its other terminal connected to the base of transistor 20 through a resistor 32. A second secondary winding 30 of transformer 24 has one terminal connected to junction 21 and its other terminal connected to the base of transistor 22 through a resistor 34. A resistor 36 may be interposed between the base of transistor 20 and junction 21 and a resistor 38 may be interposed between the base of transistor 22 and the negative terminal of source 10. Resistors 36 and 38, if utilized, are preferably of a high resistance, low voltage dissipation type and serve the function of insuring reliable startup of the circuit, particularly, at low temperatures where normal transistor collecor current leakage is low. Transformer 24 is preferably wound on a core consisting of a material with sharp saturating characteristics such as "orthonol" or "Hymu 80."

In considering the operation of the circuit of FIG. 1, let it be assumed that transistor 20 has just been switched into conductivity. Let it be further assumed that at the time of such switching, the flux density of the core of transformer 24 is at a point $-B_m$.

When transistor 20 is rendered conductive in this situation, a voltage nearly equal to half the source voltage ($E/2$) is established on primary winding 26 with the "dot" terminal thereof being positive. This action will in turn establish voltages on secondary windings 28 and 30 (their "dot" terminals also being positive) such that the base of transistor 20 is driven sharply in the negative direction, i.e., transistor 20 is supplied with heavy "turn-on" base drive. Correspondingly, transistor 22 is sharply biased to nonconductivity by the voltage on secondary winding 30. Transistor 20 now conducts heavily and transistor 22 remains nonconductive until the flux density of the core of transformer 24 attains the point $+B_m$. This can be understood from the following:

$$e=NA\frac{dB}{dt}\times 10^{-8} \quad (1)$$

$$E/2\ dt=NAdB\times 10^{-8} \quad (2)$$

$$\int_0^{\Delta t} dt=\frac{2NA}{E}\int_{-B_m}^{+B_m} dB\times 10^{-8} \quad (3)$$

$$\Delta t_1\frac{2NA}{E}(2B_m)\times 10^{-8}=\frac{4NAB_m\times 10^{-8}}{E}\text{ seconds} \quad (4)$$

At the end of the latter interval, the core of transformer 24 is at the flux condition $+B_m$.

At the instant of saturation, the voltages across the windings of transformer 24 collapse since no further change of flux density in the "+" direction is possible. This collapse rapidly produces a positive voltage at the base of transistor 20, i.e., it removes the base drive to transistor 20 so that transistor 20 moves in the non-conductive direction thereby tending to block the flow of current through primary winding 26. The leakage inductance of transformer 24, however, tends to keep this current flowing by reversing the potentials at the terminals of its windings thereby making the non-dot terminals of these windings positive. This results in the supplying of base drive to transistor 22 and bias to the base of transistor 20 to render it nonconductive. Consequently, conductivity is switched from transistor 20 to transistor 22 sharply with transistor 22 now conducting heavily and transistor 20 firmly biased into nonconductivity. The flux in the core of transformer 24 now proceeds back from $+B_m$ to $-B_m$ again taking the time in accordance with the equation:

$$\Delta t_2=\frac{4NAB_m}{E}\times 10^{-8}\text{ seconds}$$

to complete the full cycle. When the flux in the core of transformer 24 reaches the point $-B_m$, the reduction in the base drive of transistor 22 causes the leakage inductance of transformer 24 to again reverse the potentials of its windings and switch conductivity in the circuit. At this point, the same initial conditions exist as existed at the beginning of the immediately preceding cycle and sustained cyclical oscillation persists. Since the frequency of oscillation is the reciprocal of the period, frequency is in accordance with the expression:

$$f=\frac{1}{\Delta t_1+\Delta t_2}=\frac{E\times 10^8}{8NAB_m} \quad (5)$$

Figure 2:
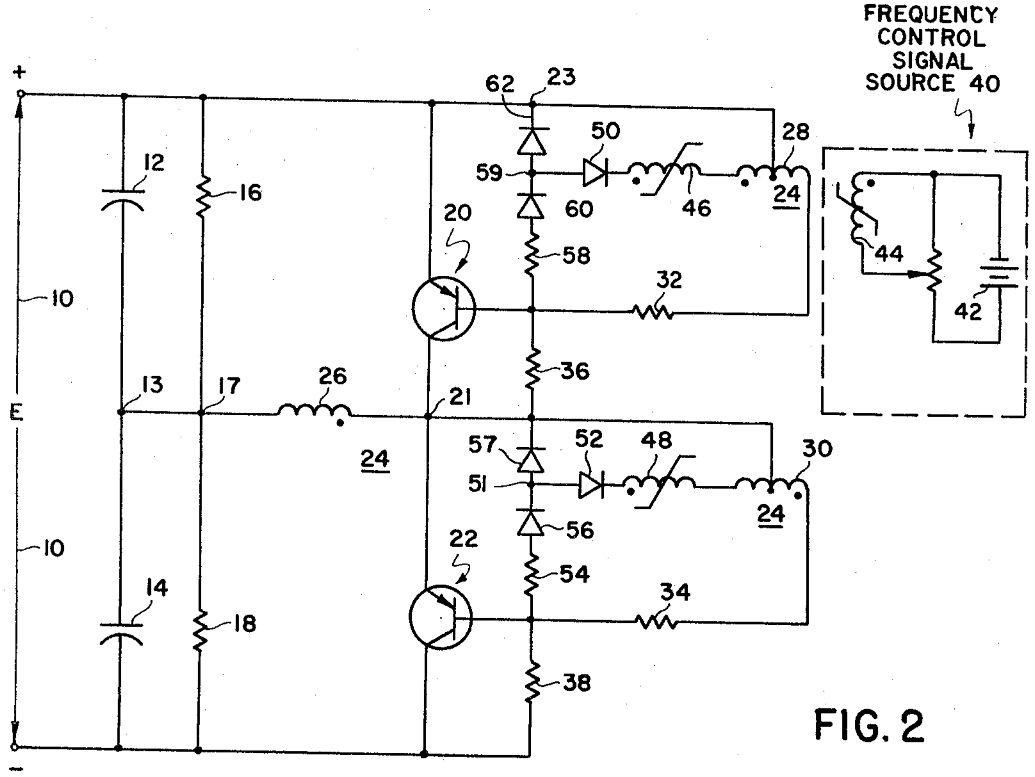
FIG. 2 is a schematic diagram of a multivibrator similar to that of FIG. 1, in which frequency control can be effected.

In FIG. 2, wherein there is shown a circuit similar to the circuit of FIG. 1 but wherein frequency control is attained with the use of a frequency control signal source 40 which includes a source 42 of D.C. potential and the control winding 44 of an amplistat, the amplistat also comprising gate windings 46 and 48, and diodes 50 and 52.

In the operation of the circuit of FIG. 2, let it be assumed that the dot terminals of the windings of transformer 24 are positive and transistor 20 is conducting. In this situation, a current flows from the dot terminal of winding 30 through resistors 34 and 54, diodes 56 and 52 and gate winding 48, the direction of current flow through gate winding 48 being such as to increase the positive ampere turns therein. When the core of the amplistat saturates in this situation, the potential at the base of transistor 22 rapidly moves in the negative direction, i.e., base drive is supplied to transistor 22 and transistor 22 is consequently rendered conductive. This causes the polarities on the windings of transformer 24 to reverse and transistor 20 is rapidly rendered nonconductive. With the polarities at the terminals of the windings of transformer 24 so switched, transistor 22 is supplied with heavy base drive and conducts heavily, transistor 20 being firmly biased into nonconductivity.

Frequency control is achieved in the circuit of FIG. 2 by selecting the value of the potential applied to control winding 44. Resistors 54 and 58 serve as current limiters. Diodes 62 and 57 serve to positively clamp the potentials at junctions 59 and 51 to the potentials at points 23 and 21 respectively. Diodes 50 and 52 provide "amplistat" gain. Diodes 60 and 56 may be included in the circuit to positively clamp the potentials at the bases of transistors 20 and 22 to the potentials at junction points 59 and 51 respectively. However, they need not be included to have satisfactory functioning of the circuit. The midpoints of secondary windings 28 and 20 are connected to points 23 and 21 respectively, the potentials at these points providing references about which the potential swings on windings 28 and 30 take place.

Transformer 24 in the circuit of FIG. 2 need not be of the saturating type. Accordingly, the use of the amplistat in the circuit of FIG. 2 to enable frequency control therein also presents the added advantage of the saving enabled by the elimination of the need for a saturable transformer.

It is to be realized that, in the circuit of FIG. 2, as the current through control winding 44 is increased, the frequency of oscillation of the circuit is progressively decreased until the core of the amplistat is completely reset during each half cycle of operation. It is further to be realized, that the "control" signal for determining the level of the current through control winding 44 may be the algebraic sum of a plurality of isolated signals applied to an equal plurality of separate control windings for the amplistat.

It is seen that in the circuit of FIG. 2, the frequency of oscillation thereof may be affected in two ways, viz., (1) if the current through control winding 44 is increased, frequency is decreased and, (2) if the D.C. supply voltage is increased, frequency is increased since the voltages in secondary windings 28 and 30 swing about the D.C. supply voltage.

Figure 3:
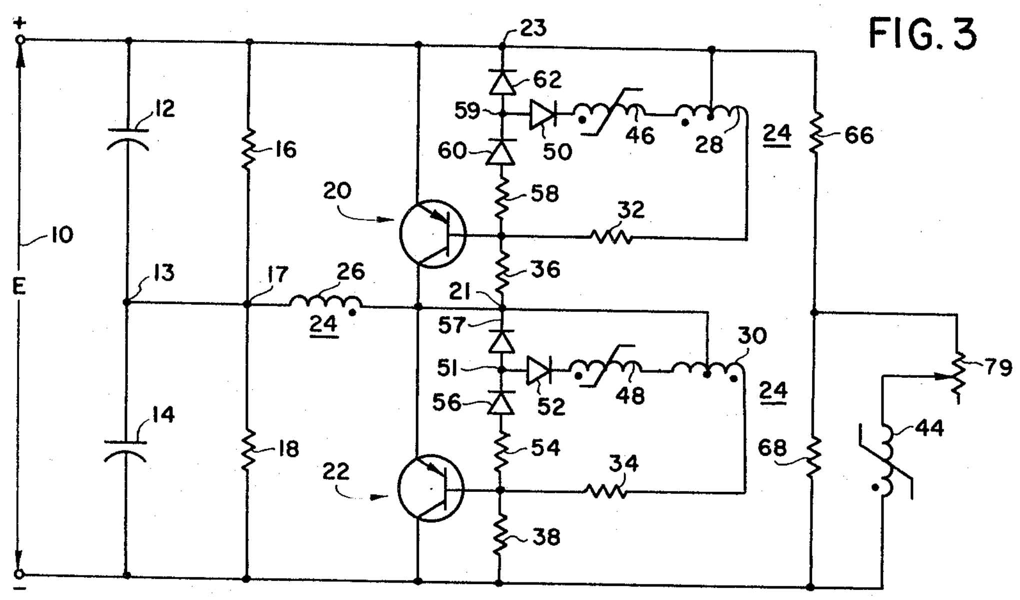
FIG. 3 is a schematic diagram of a multivibrator similar to that depicted in FIG. 2, wherein the maintaining of a constant frequency output is accomplished.

In FIG. 3, there is shown a circuit similar to that of FIG. 2 wherein the oscillator frequency may be maintained constant despite a variation within selected limits of the D.C. supply voltage. It is readily appreciated that if the control signal voltage for resetting the core of the amplistat is maintained at a constant value, as the supply voltage is increased, the frequency of the oscillator is increased proportionately. In the circuit of FIG. 3, the series arrangement of resistors 66 and 68 connected across D.C. source 10 in association with the control winding 44 of the amplistat and a variable resistor 79 provide a control signal which is proportional to the supply voltage. By proper choice of the values of resistors 66, 68 and 79 respectively and the number of turns on control winding 44, the frequency of the circuit can be "flat compensated" so that over the linear range of the operation of the amplistat, the multivibrator frequency is made substantially independent of the voltage from the D.C. supply. Such compensation arrangement has been found to be very reliable since the frequency of the output of the multivibrator is essenitally determined by the characteristics of the core material of the amplistat. In the circuit of FIG. 3, temperature compensation, if desired, may also be effected by inserting a temperature sensitive resistor (not shown) in series arrangement with resistors 66 and 68.

Figure 4:
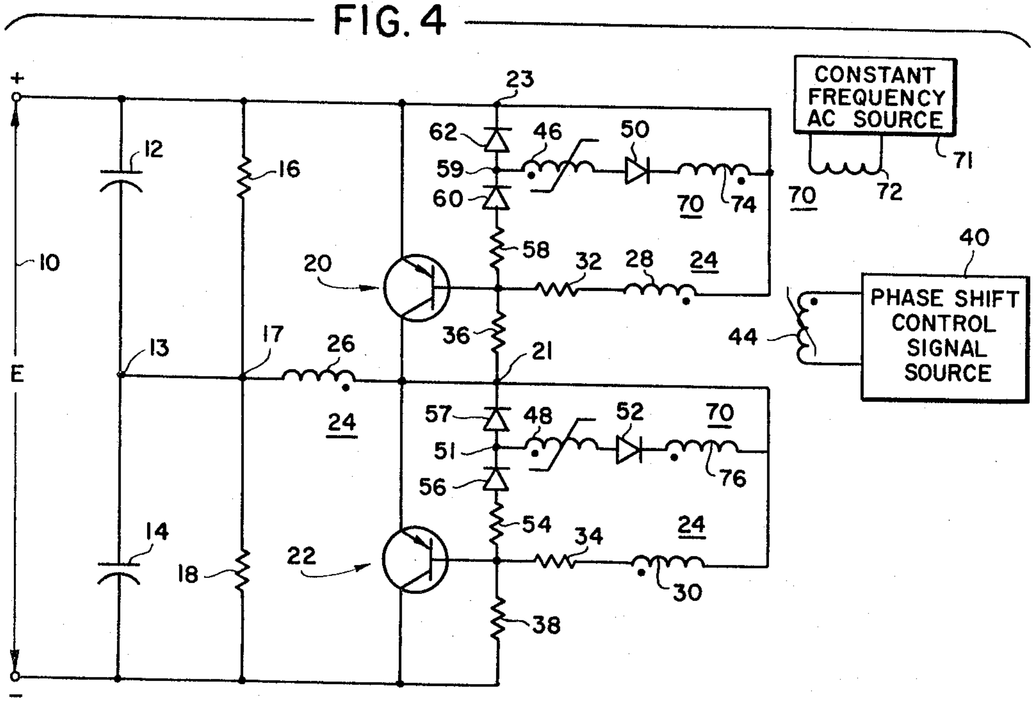
FIG. 4 is a schematic drawing of a multivibrator similar to that depicted in FIG. 3 wherein the output of the multivibrator may be synchronized with a master signal over a phase displacement of approximately 180°.

In many situations, it is desired to synchronize the output of a multivibrator oscillator to an alternating current signal of a chosen frequency and amplitude. An example of such a situation might be one wherein it is desired to synchronize the output of the multivibrator to an external constant frequency alterntaing current source such that the output of the multivibrator is a square wave of constant frequency independent of fluctuations in the level of the voltage of the D.C. supply. Further, it is frequently desired to be able to control the relative phase shift between the output of the multivibrator and its "master," i.e., the external driving signal source. In FIG. 4, there is shown a circuit in accordance with the principles of this invention wherein such objects can be accomplished.

In FIG. 4, it is noted that the terminals of secondary windings 28 and 30 of transformer 24 are connected to points 23 and 21 respectively, i.e., they are not center tapped. The secondary windings 74 and 76 of a transformer 70 are inserted between diode 50 and point 23 and diode 52 and point 21 respectively, the primary winding 72 of transformer 70 having developed thereacross the output from A.C. signal source 71, source 71 suitably producing a voltage output of a constant frequency.

In the operation of the circuit of FIG. 4, the current for resetting the core of the amplistat is determined by the voltages appearing in windings 74 and 76 respectively. Thus, assuming the situation where transistor 20 is conducting whereby the dot terminals of the windings of transformer 24 are positive, current flows through gate winding 46 provided that the dot terminals of windings 74 and 76 are also positive, i.e., their non-dot terminals are negative. Thus, it is the current supplied from external source 71 which effects the switching of the saturation direction of the core of the amplistat. The relative phase shift is controlled by applying appropriate D.C. signals to control winding 44. As control current through winding 44 is increased, the phase of the output of the multivibrator increasingly lags the signal from source 71 until the core of the amplistat is fully reset during each half cycle interval of operation. With suitable designing of the amplistat, i.e., the appropriate selection of winding turns, core area and flux density, the phase lag of the output of the multivibrator with respect to the output of the external alternating current source can be adjusted over a range of 0° to almost 180°.

Figure 5:
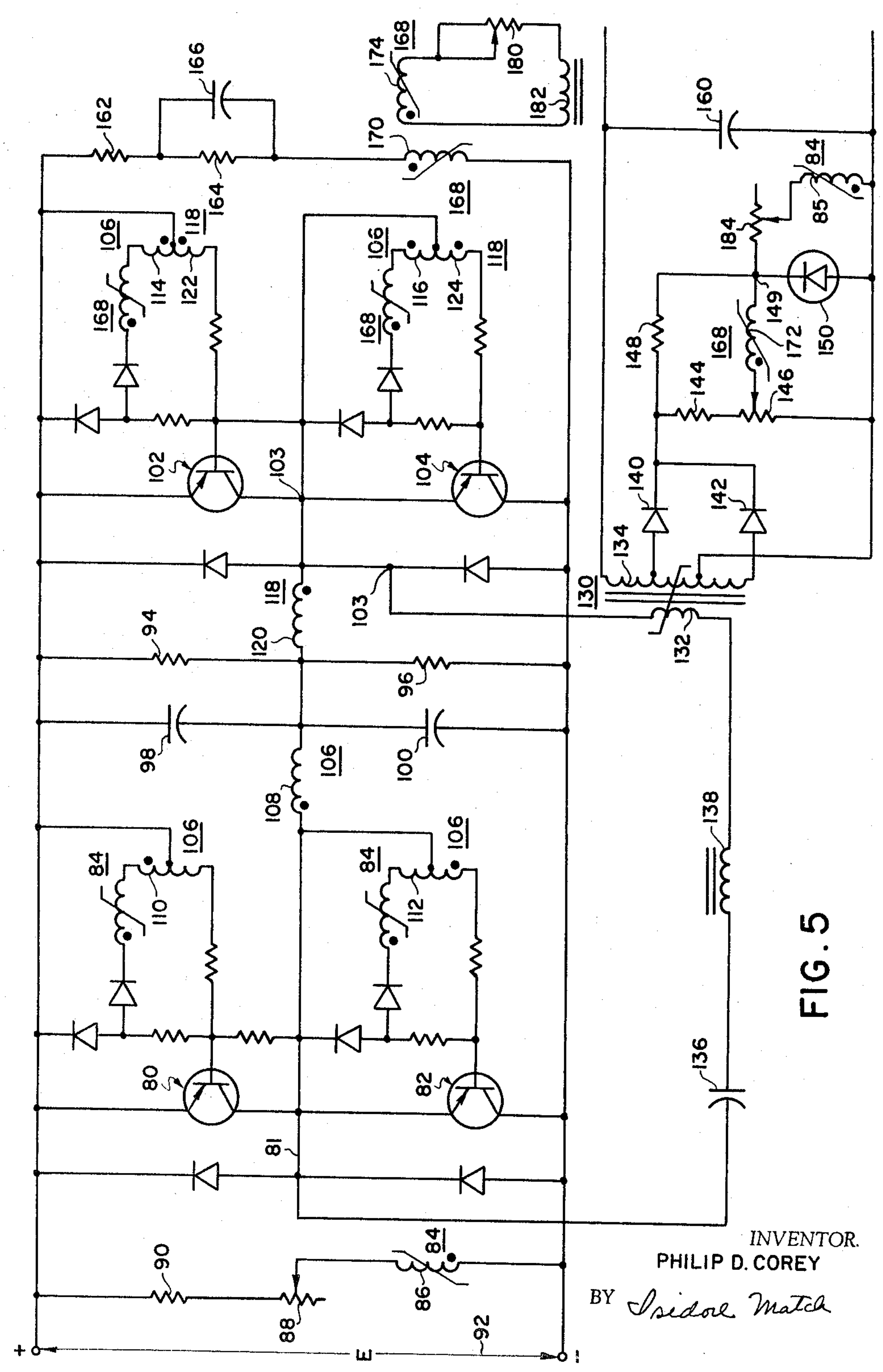
FIG. 5 is a schematic diagram of a static inverter constructed in accordance with the principles of the invention utilizing the multivibrator shown in FIGS. 1–4.

In FIG. 5, there is shown a static inverter in accordance with the principles of the invention, which is capable of operating from a relatively high voltage source and which produces a constant frequency and voltage output despite fluctuations in the D.C. supply voltage and output load. In this circuit, transistors 80 and 82 and their associated circuit components comprise a circuit essentially similar to that depicted in FIG. 3. The control winding 86 of an amplistat 84 which is in series arrangement with a variable resistor 88 and a resistor 90, the series arrangement being connected across a D.C. source 92, establishes a constant frequency output despite variations in the D.C. supply. The series arrangement connected across source 92 of resistors 94 and 96 shunted by capacitors 98 and 100 respectively, establishes a center-tapped D.C. supply.

Transistors 102 and 104 and their respective associated circuit components provide a multivibrator similar to that disclosed in FIG. 4. In the portion of the circuit of FIG. 5 which includes transistors 102 and 104, the secondary windings 114 and 116 which effect the resetting of the core of amplistat 84 are secondary windings of transformer 106. Windings 122 and 124 are secondary windings of a transformer 118 which also comprises a primary winding 120, secondary windings 122 and 124 effecting the application of base drive to transistors 102 and 104.

The junction 103 of the collector of transistor 102 and the emitter of transistor 104 is connected to one terminal of primary winding 132 of a saturable output transformer 130 and the junction 81 of the collector of transistor 80 and the emitter of transistor 82 is connected to the other terminal of primary winding 132 through the series arrangement of a capacitor 136 and a linear inductor 138. The output of the circuit is developed across a portion of the secondary winding 134 of transformer 130. A portion of the voltage across secondary winding 134 is full wave rectified by diodes 140 and 142 and this full wave rectified voltage is applied across the series arrangement of a resistor 144 and a variable resistor 146 and is also applied across the series arrangement of a resistor 148 and the cathode to anode path of a breakdown diode 150. A control winding 172 of amplistat 168 is connected between the slider on variable resistor 146 and the junction 149 of resistor 148 and the cathode of diode 150. A capacitor 160 is connected across the output portion of secondary winding 134.

Connected across the D.C. supply source 92 is the series arrangement of a resistor 162, a resistor 164 shunted by a capacitor 166 and a control winding 170 of amplistat 168 to provide a signal through winding 170 which is proportional to the D.C. supply voltage. An auxiliary winding 174 of amplistat 168 in series arrangement with a variable resistor 180 and an inductor 182 is utilized as a stabilizing device.

The voltage developed across breakdown diode 150 has a value which is directly proportional to the desired output voltage. A voltage greater than such voltage will cause a current to flow through control winding 172 in a direction to increase the positive ampere turns therein and thereby to decrease the phase lag between the outputs of the two multivibrator portions of the circuit, and a voltage less than the desired voltage causes a current to flow through control winding 172 to increase the phase lag between the aforesaid outputs.

In considering the operation of the circuit of FIG. 5, initially, with amplistat 168 in the saturated condition, the multivibrator comprising transistors 102 and 104 operates at the same frequency as that of the "master" multivibrator comprising transistors 80 and 82, and essentially in phase therewith. In this situation, the voltage applied to primary winding 132 of output transformer 130 approaches zero. Now, the voltage generated between junction 149 and the slider on resistor 146 will apply a signal to control winding 172 to reset amplistat 168 and, as operation proceeds, there will be a progressively increasing phase lag in the output of the multivibrator comprising transistors 102 and 104 with respect to the output of the multivibrator comprising transistors 80 and 82. Consequently, there results the application of quasi-square wave voltage to primary winding 132. When the desired output voltage level is achieved, the signal thereafter applied to control winding 172 will be such as to maintain a regulated output voltage by controlling the relative phase shift of the two multivibrators.

In the circuit of FIG. 5, a series arrangement of a variable resistor 184 and a control winding 85 of amplistat 84 is included to provide a fixed bias for amplistat 84 to insure that within a particular design, the optimum operating point for amplistat 84 will be achieved such that there will be minimum frequency fluctuation resulting from input D.C. voltage fluctuations.

Inductor 138 and capacitor 136 resonate at the frequency of the output of the circuit, i.e., the desired fundamental output frequency. Inductor 138 has a high impedance to higher harmonics as compared to the impedance of series connected capacitor 136 and parallel connected capacitor 160 and therefore has most of the harmonics dropped across it. Capacitor 160 also supplies energy to the output during portions of the cycle.

Transformer 130 may be chosen to be of the saturable type so that it saturates at overvoltages. In this manner, therefore, it functions as an average voltage clamp, thereby reducing the amplitude and duration of overvoltage transients.

It is to be noted that the voltage developed across breakdown diode 150 is not purely a unidirectional voltage, but is a unidirectional voltage with a small slice taken out of it each half cycle due to the nature of the voltage waveforms applied thereto. With such arrangement, there is, accordingly, desirably regulated substantially the R.M.S. output voltage rather than the average voltage. Voltage adjustment is accomplished with variable resistor 146.

Figure 6:
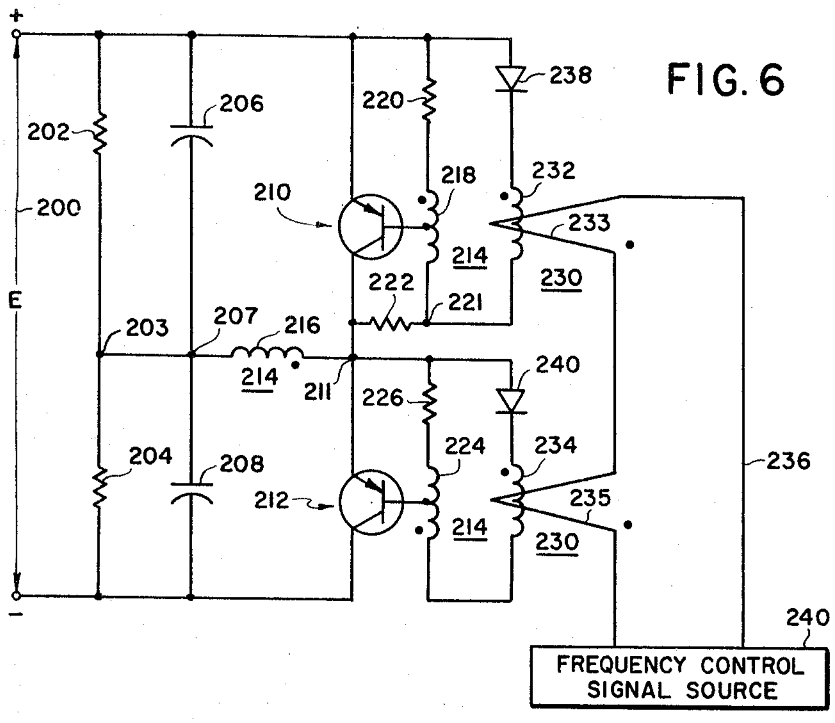
FIG. 6 is a schematic drawing of a second embodiment of a multivibrator in accordance with the principles of the invention.

In FIG. 6, there is shown a multivibrator in accordance with the principles of this invention whereby switching is effected by the abruptly rendering nonconductive of the fully conductive transistor when the amplistat in the circuit attains saturation. In this multivibrator, the series arrangement of resistors 202 and 204 and capacitors 206 and 208 connected across the D.C. source 200 (not shown) with their respective junctions 203 and 207 connected to each other serve to provide a center tapped D.C. source whereby each transistor only has to switch a voltage of E (the voltage of source 200) rather than 2E. The emitter to collector paths of transistors 210 and 212 are also connected in series arrangement across source 200, the primary winding 216 of a commutation transformer 214 being connected between junction 207 and the junction 211 of the collector of transistor 210 and the emitter of transistor 212. The base of transistor 210 is connected to the positive terminal of source 200, through half of a secondary winding 218 of transformer 214 and a resistor 220 and is connected to junction 211 through the other half of secondary winding 218 and a resistor 222, resistor 222 serving to insure reliable start-up of the circuit, particularly at low temperature, as described hereinabove in connection with the circuits of FIGS. 1 to 5. The base of transistor 212 is connected to the mid-point of a secondary winding 224 of transformer 214, winding 224 having one terminal connected to junction 211 through a resistor 226.

An amplistat 230 has one gate winding 232 connected at one terminal to the positive terminal of source 200 through the cathode to anode path of a diode 238 and its other terminal connected to secondary winding 218. A second gate winding 234 of amplistat 230 has one terminal connected to junction 211 through the cathode to anode path of a diode 240 and its other terminal connected to secondary winding 224. The control winding 236 of amplistat 230 receives its control signal from frequency control signal source 240 as shown, source 240 being similar to like stages as has been described hereinabove in the circuits of FIGS. 1–5.

In considering the operation of FIG. 6, let it be assumed that transistor 210 is fully conductive. In this situation, the dot terminals of the windings of transformer 214 are positive. The dots on the windings of the amplistat indicate the direction of current flow therethrough to produce positive ampere turns therein. With transistor 210 conducting, current flows from the positive terminal of source 200 to junction 221 through diode 238 and gate winding 232. When the core on which winding 232 is wound saturates, the voltage at junction 221 moves abruptly in the positive direction and the base drive on transistor 210 collapses to render transistor 210 substantially immediately nonconductive, whereby the polarities of the terminals of the windings of transformer 214 rapidly switch, and base drive is initiated for transistor 212.

While transistor 210 is conducting, transformer action between portions 233 and 235 of control winding 236 causes portion 235 to drive the core on which winding 234 is located in the negative saturation direction. Now when transistor 212 is rendered conductive, the same events ensue as when transistor 210 conducts. Thus, when the core on which winding 234 is wound, saturates, transistor 212 is abruptly rendered nonconductive and substantially simultaneously transistor 210 is driven into conductivity to initiate the next cycle of output from the multivibrator.

Figure 7:
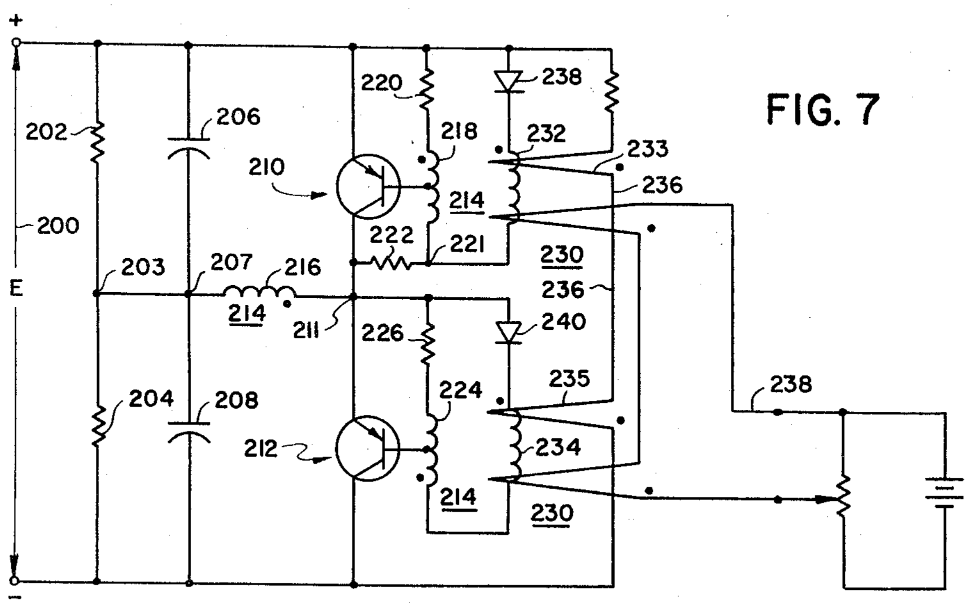
FIG. 7 is a schematic depiction of a multivibrator similar to that depicted in FIG. 6.

FIG. 7 depicts a circuit substantially similar to FIG. 6 except that the signal for control winding 236 of the amplistat which determines the frequency may be obtained therein from the D.C. source whereby there is insured that the control signal is proportional to the source voltage and in this manner the circuit is substantially "flat compensated" for fluctuations in the D.C. supply. A control winding 238 is included to provide a fixed bias to gate windings 232 and 234 of the amplistat.

Figure 8:
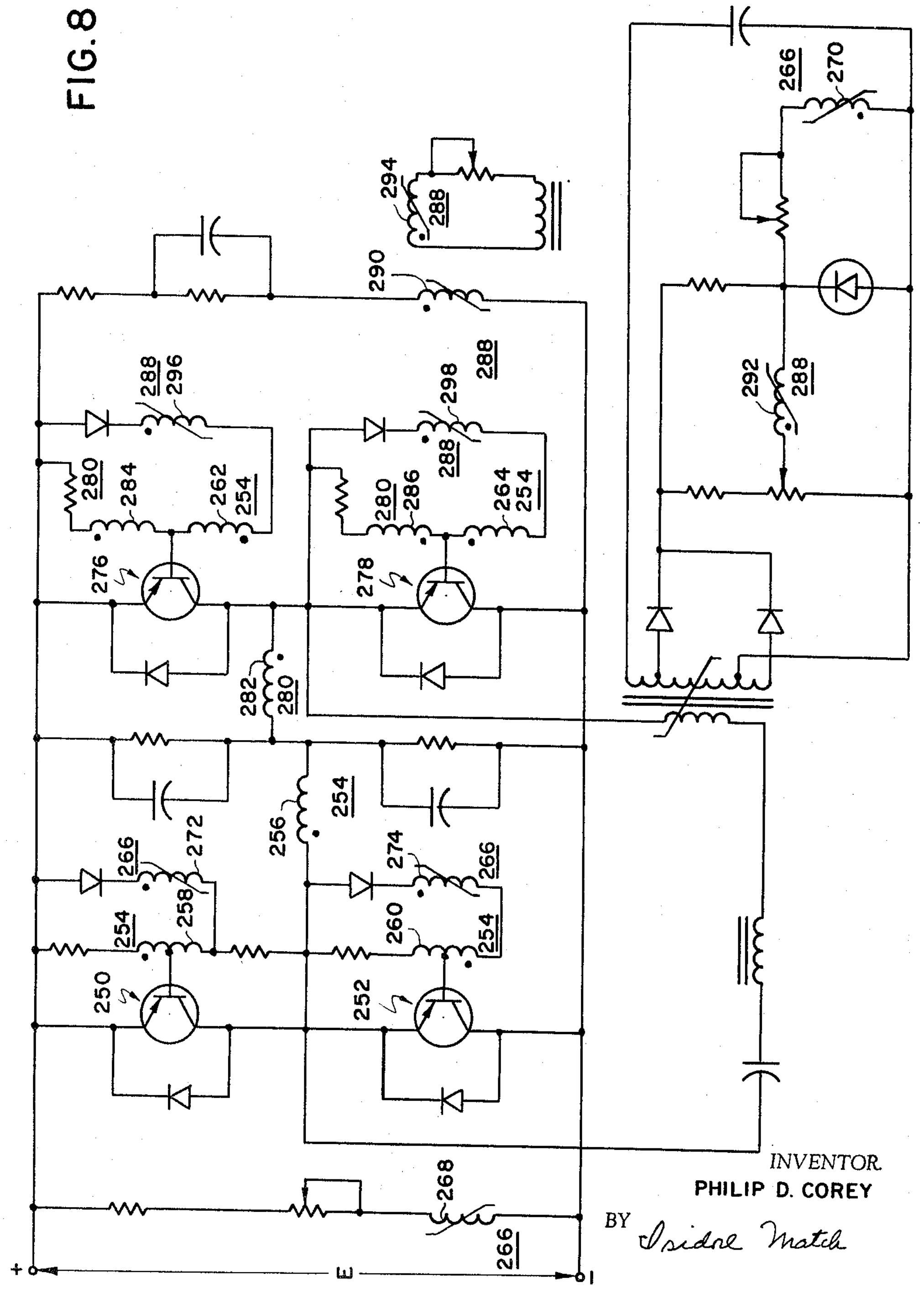
FIG. 8 is a schematic drawing of a static inverter constructed in accordance with the principles of the invention and utilizing therein the multivibrator depicted in FIG. 6.

In FIG. 8, there is shown a static inverter in accordance with the principles of the invention, utilizing as the multivibrators therein a pair of circuits such as the one depicted in FIG. 6. In this circuit, the commutation transformer 254 for the multivibrator comprising transistors 250 and 252 comprises a primary winding 256, and secondary windings 258, 260, 262 and 264. The amplistat 266 for this multivibrator comprises a frequency determining control winding 268, a constant bias control winding 270 and gate windings 272 and 274.

The transformer 280 associated with the multivibrator comprising transistors 276 and 278 comprises a primary winding 282 and secondary windings 284 and 286. The amplistat associated with this multivibrator comprises a D.C. input voltage compensating control winding 290, an output voltage sensing control winding 292, a stabilizing control winding 294 and gate windings 296 and 298. The other circuit components of the inverter correspond to like components in the static inverter depitced in FIG. 5.

In considering the operation of the circuit of FIG. 8, the multivibrator comprising transistors 250 and 252 and their associated circuit components is the "master" oscillator and the multivibrator comprising transistors 276 and 278 and their associated circuit components is the "slave" oscillator.

In such operation, let it be assumed initially that transistor 250, is first to be rendered conductive. Consequently, the dot terminals of the windings of transformer 254 are positive and base drive is supplied to transistor 276 to render it substantially simultaneously conductive. Now, when the core on which winding 272 is wound saturates to cause transistor 250 to be rendered nonconductive and to cause transistor 252 to be rendered conductive with a consequent switching of the polarities of the terminals of the windings of transformer 254, conductivity is substantially concurrently switched from transistor 276 to transistor 278. Let it now be further assumed that as operation proceeds, a voltage appears across control winding 292 in the output voltage comparison bridge. In this situation, transistor 250 could be conductive and yet transistor 278 would be non-conductive until the dot terminal of secondary winding 286 goes negative. At the time that the dot terminal of winding 258 is positive and the dot terminal of winding 286 is negative, transistors 250 and 278 conduct concurrently with exciting current being supplied to amplistat winding 272 to drive it toward positive saturation. During such concurrent conduction, current is also supplied to winding 298.

Now, when winding 272 saturates, whereby transistor 250 is rendered nonconductive and the polarities at the dot terminals of the windings of transformer 254 go negative, transistor 278 still remains conductive. Transistor 278 remains conductive until winding 298 saturates at which time conductivity is switched to transistor 276 and transistors 252 and 276 conduct concurrently. Accordingly, the output of the circuit is a quasi-square wave. The output portion of the inverter of FIG. 8 functions in the same manner as that of the inverter shown in FIG. 5.

While there have been shown particular embodiments of this invention, it will, of course, be understood that it is not wished to be limited thereto since different modifications may be made both in the circuit arrangements and in the instrumentalities employed, and it is contemplated in the appended claims to cover any such modifications as fall within the true spirit and scope of the invention.

What is claimed as new and desired to be secured by Letters Patent of the United States is:

1. In a converter, the combination with a center-tapped unidirectional potential source, of a series arrangement of a pair of transistors, each connected across one half of said source, a transformer comprising a primary winding in circuit with said transistors and said source and a pair of secondary windings, a saturable device comprising a pair of gate windings, a series arrangement of one of said secondary windings and one of said gate windings in circuit with each of said transistors, the saturation of said device in a given direction causing conduction to be switched from one to the other of said transistors, said transistors switching a potential having a value substantially equal only to the value of said source potential, and means for obtaining an output in circuit between the common junction of said transistors and said source.

2. In a comverter, the combination with a unidirectional potential source, of means for producing a center-tapped output from said source, a series arrangement of a pair of transistors, each connected across one half of said source, a transformer comprising a primary winding connected between said center and the junction of said transistors and a pair of secondary windings, a saturable device comprising a pair of gate windings and a control winding, a series arrangement of one of said secondary windings and one of said gate windings in circuit with each of said transistors, the saturation of said device in a given direction causing conduction to be switched from one to the other of said transistors, said transistors switching a potential having a value substantially equal only to the value of said source potential, a signal source in circuit with said control winding, the frequency of said switching being a function of the value of the signal applied to said control winding from said signal source, and means for obtaining an output in circuit between the common junction of said transistors and said source.

3. In a converter the combination with a unidirectional potential source, means for producing a center-tapped output from said source, of a series arrangement of a pair of transistors, each connected across one half of said source, a transformer comprising a primary winding connected between said center and the junction of said transistors and a pair of secondary windings, a saturable device comprising a pair of gate windings and a control winding, a series arrangement of one of said secondary windings and one of said gate windings in circuit with each of said transistors, the saturation of said device in a given direction causing conduction to be switched from one to the other of said transistors, said transistors switching a potential having a value substantially equal only to the value of said source potential, means in circuit with said source for deriving a control signal from said source and for applying said derived signal to said control winding, the frequency of said switching being a function of the value of said control signal, a variation in said source potential causing a commensurate variation in said signal to maintain said frequency substantially constant, and means for obtaining an output in circuit between said center-tapped output from said source and the common junction of said transistors.

4. In a converter, the combination with a center-tapped unidirectional potential source, of a series arrangement of a pair of transistors, each connected across one half of said source, a first transformer comprising a primary winding in circuit with said transistors and said source and a pair of secondary windings, each of said secondary windings being in circuit with one of said transistors respectively, a saturable device comprising a control winding and a pair of gate windings, each of said gate windings being in circuit with one of said transistors respectively, an alternating current potential source, means for applying the output of said last-named source in opposite polarity to each of said gate windings respectively, the saturation of said device in one direction causing conduction to be switched from one to the other of said transistors, said transistors switching a potential having a value substantially equal only to the value of said unidirectional source potential, a signal source in circuit with said control winding, the frequency of said switching being in accordance with the frequency of said alternating current potential source, the phase lag between the output of said transistors and the respective half cycles of output from said alternating current source being a function of the value of said signal, and means for obtaining an output in circuit between said center-tap of said source and the common junction of said transistors.

5. In the combination defined in claim 4 wherein said means for applying the output of said alternating current potential source to said gate windings comprises a second transformer having a pair of secondary windings, each of said windings being in circuit with one of said respective gate windings.

6. In the combination defined in claim 5 wherein said primary winding is connected between said center and the junction of said transistors.

7. A circuit for converting the output of a unidirectional center-tapped potential source to an alternating current power output comprising a first multivibrator comprising a first pair of transistors serially connected across said source, a first transformer comprising a primary winding in circuit with said first pair of transistors and a plurality of secondary windings, each of a first pair of said secondary windings of said first transformer being in circuit with one of said first pair of transistors, a first saturable device comprising a plurality of control windings and a plurality of gate windings, each of a pair of said gate windings in circuit wth a transistor and a secondary winding of said first pair respectively, means in circuit with one of said control windings for deriving a signal from said source and applying it to said control winding, a second multivibrator comprising a second pair of transistors serially connected across said source, a second transformer comprising a primary winding in circuit with said second pair of transistors and said source and a pair of secondary windings, each of said last-named pair of windings being in circuit with one of said second pair of transistors, a second saturable device comprising a plurality of control windings and a plurality of gate windings, each of a pair of said second gate windings being in circuit with a respective one of said second pair of transistors and one of a second pair of secondary windings of said first transformer, means in circuit with said source for deriving a signal therefrom and applying it to one of the control windings of said second saturable device, and add and output means in circuit between the common junction of said first pair of serially connected transistors and the common junction of said second pair of serially connected transistors.

8. The circuit defined in claim 7 and further including a reference voltage source, and means in circuit with said reference voltage source and a second control winding of said second saturable device for comparing the output voltage of said circuit with said reference source voltage and applying the difference voltage resulting from said comparison to said second control winding.

9. In a converter, the combination with a center-tapped unidirectional potential source, of a series arrangement of a pair of transistors, each connected across one half of said source, a transformer comprising a primary winding in circuit with said source and said transistors and a pair of secondary windings, each of said secondary windings being in circuit with a respective one of said transistors, a saturable device comprising control winding means and a pair of gate windings, each of said gate windings being connected in circuit with said source and a respective one of said secondary windings, a signal source in circuit with said control winding means, and means for obtaining an output in circuit between the common junction of said transistors and the center of said unidirectional source.

10. In the combination defined in claim 9 wherein said primary winding is connected between said center and the junction of said transistors.

11. A circuit for converting the output of a center-tapped unidirectional potential source to an alternating current power output comprising a first multivibrator comprising a first pair of transistors serially connected across said source, a first transformer comprising a primary winding in circuit with said first pair of transistors and a plurality of secondary windings, each of a first pair of said secondary windings being in circuit with one of said respective transistors, a first saturable device comprising a plurality of control windings and a plurality of gate windings, each of a pair of said gate windings in circuit with one of said first secondary windings and said source, means in circuit with said source and a control winding of said first saturable device for deriving a signal from said source and applying it to said control winding, a second multivibrator comprising a second pair of transistors serially connected across said source, a second transformer comprising a primary winding and a pair of secondary windings, each of said last named pair of windings being in circuit with one of said second pair of transistors, a second saturable device comprising a plurality of control windings and a plurality of gate windings, a second pair of secondary windings of said first transformer each in circuit with a respective one of said second pair of transistors, each of said second gate windings being in circuit with said source and one of said second pair of secondary windings of said first transformer, means in circuit with said source for deriving a signal therefrom and applying it to one of the control windings of said second saturable device, and output means in circuit between the common junction of said first pair of serially connected transistors and the common junction of said second pair of serially connected transistors.

References Cited by the Examiner

UNITED STATES PATENTS

| | | | |
|---|---|---|---|
| 2,897,433 | 7/1959 | Putkovich et al. | 321—45 |
| 3,047,789 | 7/1962 | Lowry | 321—45 |
| 3,074,031 | 1/1963 | Hoge | 321—18 X |
| 3,120,633 | 2/1964 | Genuit | 321—18 X |
| 3,175,167 | 3/1965 | Lloyd | 318—138 |
| 3,210,689 | 10/1965 | Burwen | 307—88.5 |

FOREIGN PATENTS

| | | |
|---|---|---|
| 572,804 | 11/1958 | Belgium. |

JOHN F. COUCH, *Primary Examiner.*

LLOYD McCOLLUM, *Examiner.*

J. M. THOMSON, M. L. WACHTELL, *Assistant Examiners.*